United States Patent [19]
Boice et al.

[11] Patent Number: 6,127,851
[45] Date of Patent: Oct. 3, 2000

[54] CIRCUIT AND METHOD FOR DIFFERENTIATING MULTIPLE MODULES

[75] Inventors: Charles Edward Boice; John Mark Kaczmarczyk, both of Endicott; Michael Patrick Vachon, Johnson City, all of N.Y.

[73] Assignee: International Business Machines Corporation, Armonk, N.Y.

[21] Appl. No.: 09/238,090

[22] Filed: Jan. 26, 1999

[51] Int. Cl.[7] .................................................. H01L 25/00
[52] U.S. Cl. .......................... 326/101; 326/38; 326/82; 326/105
[58] Field of Search ............................... 326/37, 38, 101, 326/80, 82, 105

[56] References Cited

U.S. PATENT DOCUMENTS

| | | |
|---|---|---|
| 4,721,868 | 1/1988 | Cornell et al. . |
| 5,023,483 | 6/1991 | May . |
| 5,198,707 | 3/1993 | Nicolai ..................................... 307/475 |
| 5,880,596 | 3/1999 | White ......................................... 326/38 |
| 5,955,912 | 9/1999 | Ko ........................................... 327/410 |
| 6,034,539 | 3/2000 | Hwang ..................................... 326/38 |

*Primary Examiner*—Michael Tokar
*Assistant Examiner*—Don Phu Le
*Attorney, Agent, or Firm*—John R. Pivnichny

[57] ABSTRACT

More than 2 power N external conditions are determined by a circuit package. Connections are made from N inputs to either a first or second contact at either a first or second logic state respectively or to digital outputs. The outputs may be sequentially placed at either the first or second logic state. By recording an indication signal from the inputs an electronic circuit is adapted to determine more than 2 power N conditions.

23 Claims, 4 Drawing Sheets

CIRCUIT AND METHOD FOR DIFFERENTIATING MULTIPLE MODULES

TECHNICAL FIELD

The invention relates generally to determining on which of a number of circuitized substrates a circuit is mounted. More particularly, the invention relates to differentiating more than 2 power N substrates using N circuit input pins.

BACKGROUND OF THE INVENTION

In the manufacture of electronic components it is customary to mount one or more semiconductor chips on a substrate. The substrate provides a supporting and protecting structure for the relatively delicate chip while also bringing the relatively closely spaced electrical contacts on the chip out to a set of contacts on the substrate which are positioned in a more convenient arrangement for making connections to points external to the chip-carrying substrate. Such contacts are known for example as a pin grid array, surface mount contacts, and ball grid array contacts. It is often advantageous if a single chip design can be mounted on more than one particular substrate. For example a specialized ASIC chip might be mounted in a ceramic pin grid array with heat sink and operated at a high clock rate and high power for one application. For another, perhaps portable, application the same chip may be mounted on an organic ball grid array carrier and operated at low speed and low power. In other applications, a video encoder or video decoder ASIC chip for example, may be mounted in a variety of packages depending on the application.

It is particularly advantageous in some applications for the electronic circuits on the chip to be able to sense a variety of conditions unique to the application including what package type it is mounted in, a desired operating speed, or power level. Consequently one or more input pins are connected externally or within the package to a power or ground point as a way of indicating such conditions.

It is known to decode one of two conditions at a single input by determining whether the input is at a first or second logic state. Furthermore it is known that by corresponding use of N inputs, a total of 2 to the $N^{th}$ power ($2^N$) conditions can be determined. Cornell et al, in U.S. Pat. No. 4,721,868, for example, describes a scheme for indicating $2^N$ conditions by connecting each of N inputs to ground through a programmable fuse. Programming circuitry can then selectively "blow out" fuses on specific inputs allowing those inputs to rise to a second logic state while other inputs remain connected to ground.

In many applications, particularly for ASIC chips, the total number of external connections is limited by the number of bond pads or C4 pads on the chip. While progress in semiconductor chip processing has dramatically increased the amount of circuitry which can be placed on a chip, the number of bond pads has increased only slightly over the same time period. As a result, the number of available bond pads has become a limiting factor with each becoming a valuable resource. The number of bonds pads devoted to sensing the type of conditions described above must therefore be kept to an absolute minimum.

A method which increases the number of conditions which can be sensed using N inputs would therefore represent a significant advance in the art of semiconductor application design.

In U.S. Pat. No. 5,023,483, May describes an apparatus and method for decoding four conditions with one pin. The four conditions involve connecting the pin to either a first or second logic state using either a high or low value of resistance. Rather complex circuitry involving memory, an isolator circuit, default circuit, read circuit and write circuit then attempt to drive and sense the logic state of the pin. When a high value of resistance is used for the connection, it is possible to drive the pin to the opposite logic state from the state to which it is connected, by use of a sufficiently powerful driver which can overcome the high value of resistance. When a low value of resistance is used for the connection, then the driver cannot overcome the effect of the resistor and it is not possible to drive the pin to the opposite logic state. These four conditions can therefore be determined through use of the complex circuitry and methods described by May.

OBJECTS AND SUMMARY OF THE INVENTION

It is therefore an object of the present invention to provide an improved method and apparatus for differentiating more than $2^N$ conditions using N circuit input pins using simple circuitry and without requiring resistive elements for the connections. It is another object to provide a circuit package with N connections for differentiating more than $2^N$ conditions.

It is yet another object to provide a method of determining more than $2^N$ conditions with N connections.

These and other objects are attained in accordance with one embodiment of the present invention wherein there is provided a circuit package comprising a substrate having first and second electrical contacts adapted for being at first and second digital states, respectively, an electronic circuit adapted for providing a digital output capable of being provided at the first and second digital states in sequential fashion, input means coupled to the electronic circuit capable of providing an indication signal of whether the input means is at either the first or the second digital state, means for making an electrical connection between the input means and either the digital output, or the first electrical contact, or the second electrical contact, and the electronic circuit further adapted for sequentially providing the digital output at each of the first and second digital states and sequentially recording the indication signal provided by the input means to determine whether the input means is connected to the digital output, or the first contact, or the second contact.

In accordance with another embodiment of the invention there is provided a method for determining connections, comprising the steps of providing a substrate having first and second electrical contacts adapted for being at first and second digital states, respectively, providing an electronic circuit adapted for providing a digital output capable of being at the first and second digital states in sequential fashion, providing input means coupled to the electronic circuit capable of providing an indication signal of whether the input means is at either the first or the second digital state, making an electrical connection between the input means and either the digital output, or the first contact, or the second contact, sequentially providing the digital output at each of the first and second digital states and sequentially recording the indication signal provided by the input means, and determining whether the input means is connected to either the digital output, or the first contact, or the second contact.

BEST MODE FOR CARRYING OUT THE INVENTION

For a better understanding of the present invention, together with other and further objects, advantages and capabilities thereof, reference is made to the following disclosure and the appended claims in connection with the above-described drawings.

Figure 1:
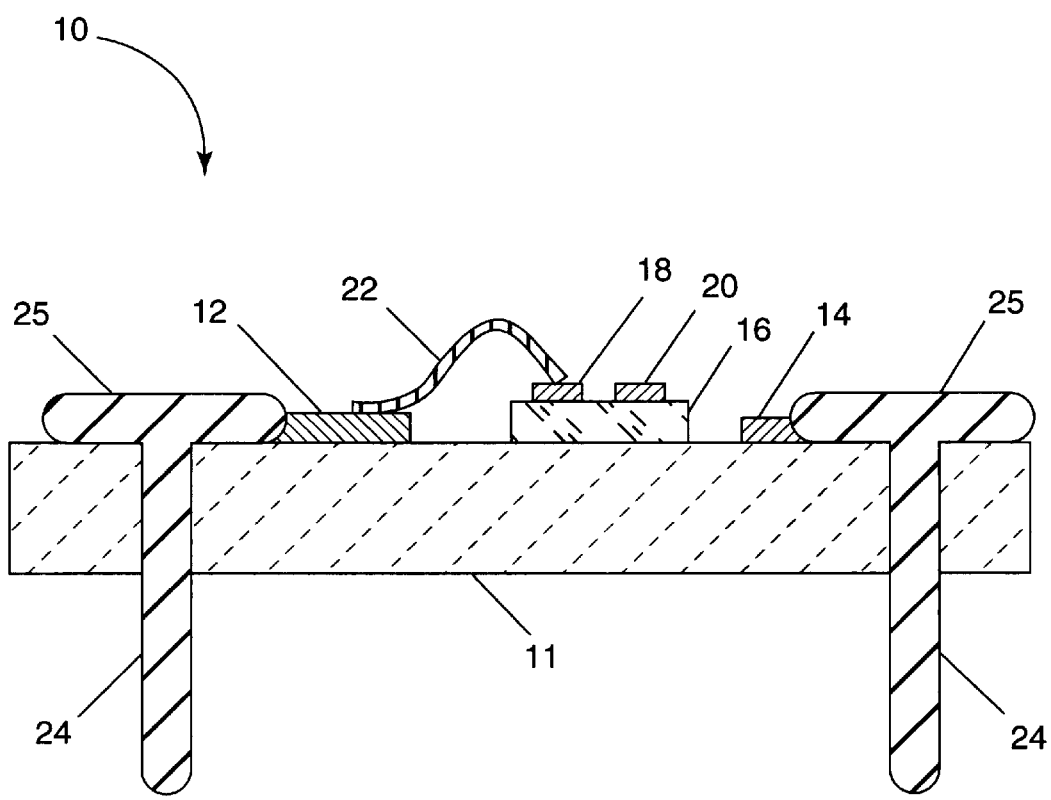
FIG. 1 is a cross section of a circuit package of the invention with a ceramic substrate.
Figure 2:
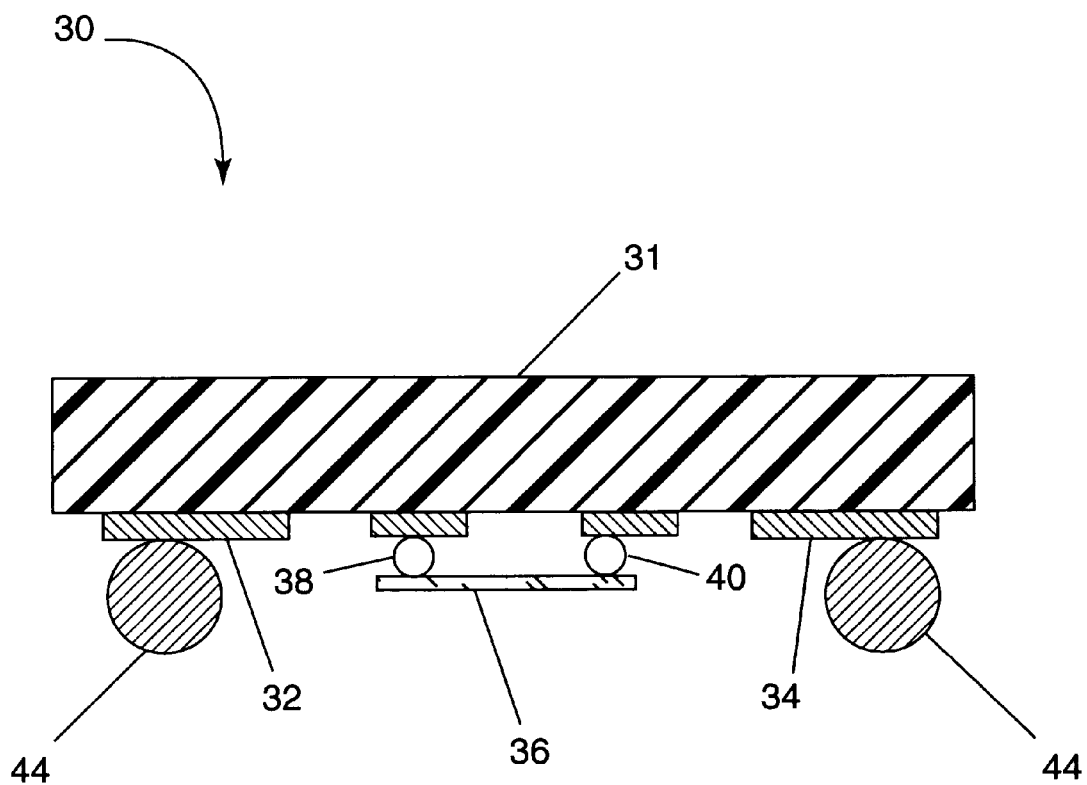
FIG. 2 is a cross section of another embodiment of the circuit package having a ball grid array substrate.
Figure 3:
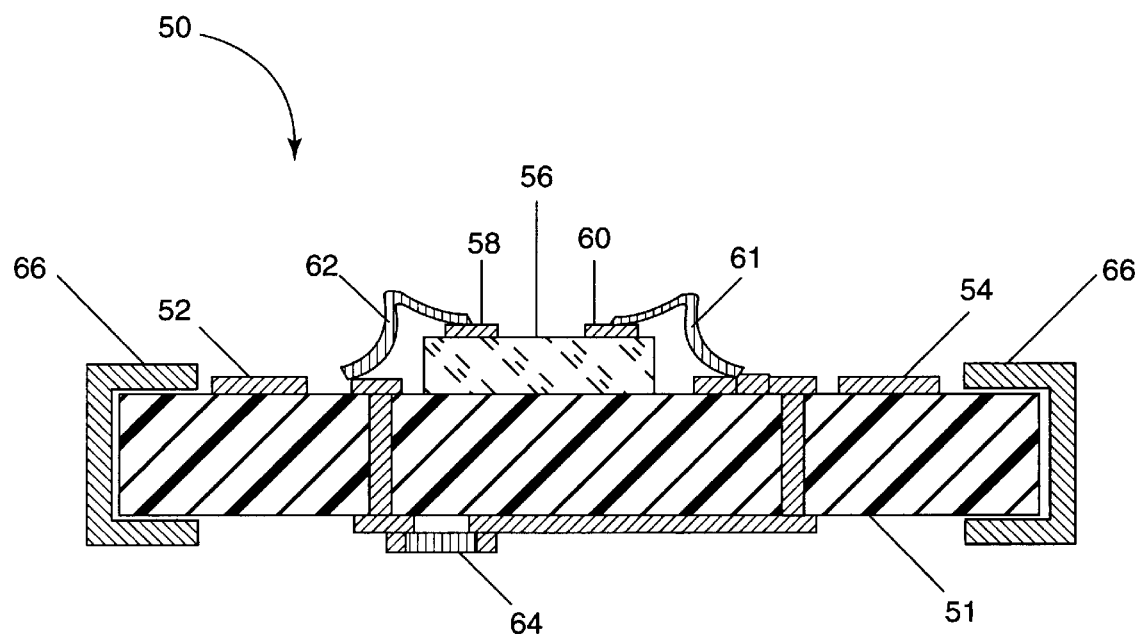
FIG. 3 is a cross section of yet another embodiment of the invention having an organic surface mount substrate and a resistor electrical connection.

In FIG. 1 there is shown a circuit package 10 in accordance with the present invention. The circuit package comprises a substrate 11 which may be ceramic as shown in FIG. 1 such as alumina, beryilia or combinations of various ceramic materials. The substrate may also be an organic substrate 31, 51 as shown in the circuit packages 30, 50 of FIGS. 2 and 3. Suitable organic materials are epoxy, TEFLON, (TEFLON is a trademark of E.I. Dupont de Nemours & Co., Inc.) polyimide, epoxy impregnated glass fibers, and various plastics used in the electronic component and circuit board arts. Substrate 11, 31, 51 may also include one or more wiring layers of electrically conductive materials such as copper, aluminum, molybdenum, silver, or other metals and semi conductor materials. Connection between layers may be provided by pins 24, edge contacts 66, or through blind vias (not shown) which are well known in the substrate art. Substrate 11 has first 12 and second 14 electrical contacts which are adapted for being at first and second digital states respectively. For example, in FIG. 1 first electrical contact 12 shown connected to a pin 25 to which an electrical potential maybe applied, corresponding to a first digital state (e.g. 5 volts). Second electrical contact 14 is shown connected to another pin to which a different electrical potential may be applied (e.g. ground) corresponding to a second digital state. In FIG. 2 respective electrical contacts 32 and 34 are shown connected to conductive balls 44 to which similar electrical potentials may be applied. In FIG. 3, respective electrical contacts 52 and 54 are connected to surface mount contacts 66 for the same reason. Electrical contacts 12, 14, 32, 34, 52, 54 could also be adapted for being at first or second digital states by being connected to other points on substrate 11, 31, 51 respectively which are capable of being at first and second digital states. A first digital state is herein understood to mean a voltage or current level or range of levels which is different from a second level or range of levels. The circuit package 10 of FIG. 1 also comprises an electronic circuit 16 which may be a semiconductor chip, discrete component, or collection of interconnected electronic components adapted for providing a digital output 20 capable of being provided at the first and second digital states described above, in sequential fashion. Digital outputs 40 and 60 of electronic circuits 36 and 56 in FIGS. 2 and 3 are likewise capable of being provided at the first and second digital states. The digital output may be in the form of a bond pad, C4 ball, or any other electrically conductive part of the electronic circuit.

One way of adapting electronic circuit 16 for providing a digital output 20 at first and second digital states is to use a logic circuit or driver circuit. Such circuits are well known to provide an output at either one or the other of two digital states. Such circuits may also provide other functions when not being used for condition determination.

Figure 4:
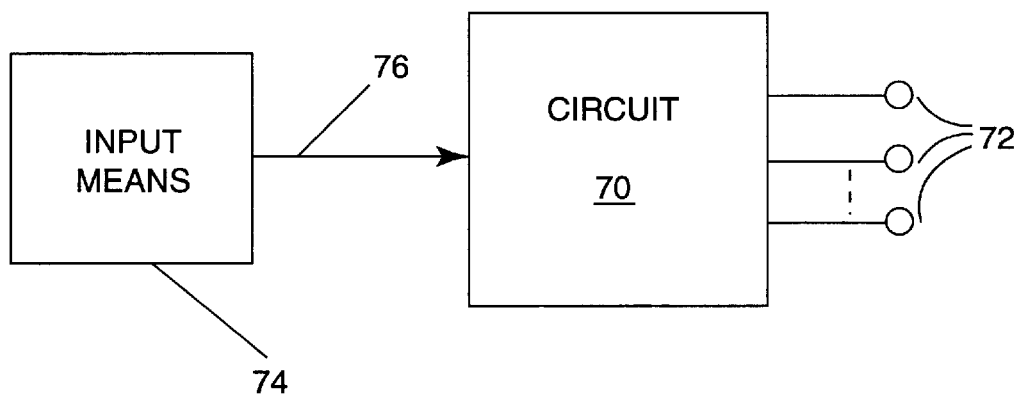
FIG. 4 is a circuit diagram of input means coupled to an electronic circuit having a plurality of digital outputs.

Circuit package 10 further comprises input means 18 coupled to electronic circuit 16 capable of providing an indication signal of whether it is at either the first or second digital state. The circuit diagram of FIG. 4 shows input means 74, coupled to electronic circuit 70, capable of providing an indication signal 76 of whether the input means is at either the first or second digital state. Electronic circuit 70 may have one or a plurality of digital outputs 72.

Input means 74 may be a receiver circuit having an input node at either a first or second logic state and an output node providing an indication signal. Input means 74 may also be a logic circuit such as an inverter or logic gate with an output capable of providing an indication signal of whether an input to such gate is at either a first or second logic state. In some applications where first and second logic states are sufficiently different that no amplification is needed, input means 74 may be merely an input node coupled electrically to the electronic circuit, such as a bond pad or C4 connection on a chip or any other electrically conductive point coupled to the electronic circuit. In this case the indication signal would be the actual voltage level of the input means itself. Other means, equivalent to the above input means, may also be used.

Returning to FIG. 1, circuit package 10 also comprises means 22 for making an electrical connection between input means 18 and either digital output 20, or first electrical contact 12 or second electrical contact 14. The means may be a wire bond as shown in FIG. 1 or a printed line, solder connection, via, wire or any other type of electrical connection known in the circuit package art.

The means for making an electrical connection does not have to be a direct electrical connection, but may also include connection through an intermediate component such as a resistor 64, which may be a chip resistor, discrete resistor, or merely a resistive material used to make the connection. Each connection whether direct or through a resistor represents one condition to be subsequently determined as described below. The electronic circuit 16 is further adapted for sequentially providing digital output 20 at each of the first and second digital states and sequentially recording the indication signal provided by input means 18 to determine whether the input means 18 is connected to the digital output 20 or the first contact 12 or the second contact 14.

An enabling sequence would be to place digital output 20 at the first digital state and record the indication signal whether the input means is at the first or second digital state. If the indication signal shows the first state, then input means is connected to either the first contact or the digital output. Otherwise the input means is connected to the second contact. Digital output 20 is then placed at the second digital state and the indication signal is again recorded. If the previously recorded signal shows a first digital state and now shows the second digital state, then the input means is determined to be connected to digital output 20. Other sequences are possible. The above description is included to show one sequence and is not meant to be a limitation. Three conditions have thus been determined using a single input means.

The above sequencing can be extended in the case of more than one digital output or more than one input means, to a longer sequence. Having disclosed the sequence for a single output and single input means, such extension will be obvious to those skilled in the digital logic design art. It will also be obvious that such extension will provide determination of more than 2 power N conditions when using N input means.

Sequencing can be provided by use of a microprocessor including a RISC (reduced instruction set processor) or with a state machine, or with ordinary sequential logic circuitry. Recording can be in the form of a memory, latch circuit, EPROM or equivalent structure.

In FIG. 2 there is shown another embodiment 30 of the invention having an organic substrate 31 with ball grid array of electrically conductive balls 44. The balls may be any electrically conductive material including copper, gold, solder, silver or conductive adhesive. Electronic circuit 36 is a semiconductor chip having C4 solder balls for digital output 40 and input means 38.

In FIG. 3 there is shown yet another embodiment 50 of the circuit package with an organic substrate 51 having surface mount contacts 66, electronic circuit 56 having wire bond pads for digital output 60 and input means 58. Wire bonds 61, 62 are shown connecting input means 58 to digital output 60 through resistor 64.

Other embodiments are possible and the above FIGS. are included by way of example of what are at present considered the preferred embodiments of the invention.

It will be obvious to those skilled in the art that various changes and modifications may be made therein without departing from the scope of the invention as defined by the appended claims.

What is claimed is:

1. A circuit package, comprising:
   a substrate having first and second electrical contacts adapted for being at first and second digital states, respectively;
   an electronic circuit adapted for providing a digital output capable of being provided at said first and second digital states in sequential fashion;
   input means coupled to said electronic circuit capable of providing an indication signal of whether said input means is at either said first or said second digital state;
   means for making an electrical connection between said input means and either said digital output, or said first electrical contact, or said second electrical contact; and
   said electronic circuit further adapted for sequentially providing said digital output at each of said first and second digital states and sequentially recording said indication signal provided by said input means to determine whether said input means is connected to said digital output, or said first contact, or said second contact.

2. The circuit package of claim 1 wherein said substrate is an organic substrate.

3. The circuit package of claim 1 wherein said substrate is ceramic.

4. The circuit package of claim 1 wherein said substrate is a ball grid array substrate.

5. The circuit package of claim 1 wherein said electronic circuit is a semiconductor chip.

6. The circuit package of claim 5 wherein said input means and said digital output further comprise C4 connections between said semiconductor chip and said substrate.

7. The circuit package of claim 1 wherein said electrical connection is a wire bond.

8. The circuit package of claim 1 wherein said input mean further comprises a plurality of inputs, each input capable of providing an indication of whether said each input is at either said first or said second digital state.

9. The circuit package of claim 1 wherein said electrical connection is a printed line.

10. The circuit package of claim 1 wherein said electrical connection further comprises a resistor.

11. The circuit package of claim 1 further comprising a plurality of digital outputs capable of being placed at either said first or said second digital states and said electrical connection is made between said input means and any one of said plurality of digital outputs or said first contact or said second contact.

12. The circuit package of claim 11 wherein said electronic circuit is further adapted for sequentially providing each of said plurality of digital outputs at each of said first and second digital states and sequentially recording said indication signal provided by said input means to determine whether said input is connected to any of said plurality of digital outputs, or said first contact or said second contact.

13. The circuit package of claim 1 wherein said electronic circuit further comprises a microprocessor.

14. The circuit package of claim 1 wherein said electronic circuit further comprises a RISC processor.

15. A method of determining connections, comprising the steps of:
   providing a substrate having first and second electrical contacts adapted for being at first and second digital states, respectively;
   providing an electronic circuit adapted for providing a digital output capable of being at said first and second digital states in sequential fashion;
   providing input means coupled to said electronic circuit capable of providing an indication signal of whether said input means is at either said first or said second digital state;
   making an electrical connection between said input means and either said digital output, or said first contact, or said second contact;
   sequentially providing said digital output at each of said first and second digital states and sequentially recording said indication signal provided by said input means; and
   determining whether said input means is connected to either said digital output, or said first contact, or said second contact.

16. The method of claim 15 wherein said substrate provided is an organic substrate.

17. The method of claim 15 wherein said substrate provided is a ceramic substrate.

18. The method of claim 15 wherein said substrate provided is a ball grid array substrate.

19. The method of claim 15 wherein said electronic circuit is provided as a semiconductor chip.

20. The method of claim 19 wherein said digital output and said input means are provided as C4 connections between said semiconductor chip and said substrate.

21. The method of claim 15 wherein said electrical connection is made by making a wire bond.

22. The method of claim 15 wherein said electrical connection is made by personalizing a printed line on said substrate.

23. The method of claim 15 wherein said electrical connection is made using a resistor.

* * * * *